United States Patent [19]
White

[11] Patent Number: 5,321,401
[45] Date of Patent: Jun. 14, 1994

[54] METHOD AND APPARATUS FOR DIGITAL TO ANALOG CONVERSION WITH MINIMIZED DISTORTION

[75] Inventor: William A. White, Garland, Tex.

[73] Assignee: Texas Instruments Incorporated, Dallas, Tex.

[21] Appl. No.: 985,790

[22] Filed: Dec. 4, 1992

[51] Int. Cl.$^5$ ............................................. H03M 1/66
[52] U.S. Cl. ..................................... 341/147; 341/144
[58] Field of Search ............... 341/147, 144, 145, 150, 341/153, 154, 134

[56] References Cited

U.S. PATENT DOCUMENTS 3,582,943  6/1971  Weller .................................. 341/144

OTHER PUBLICATIONS

M. P. Wilson et al., "Spurious Reduction Techniques for Direct Digital Synthesis", *Paper presented at Direct Digital Synthesis Conference*, University of Bradford, England, Nov. 19, 1991.

Van Andrews et al., "A Monolithic GaAs DDS For A Digital Radio Application", *Digest of Papers, Government Microcircuit Applications Conference*, 1992, pp. 431–434.

"High Speed DAC Implementations", *Paper presented at High Speed Design Seminar.* 1989.

David Buchanan, "Choose DACs For DDS System Applications", *Microwaves & RF*, Aug. 1992, pp. 89–98.

Robert J. Zavrel, Jr., "Alias and Spurious Responses in DDS Systems", *Stanford Telecom, ASIC & Custom Products Group*, Mar., 1990, pp. 7–10.

Kenji Maio et al., "A 500-MHz 8-Bit D/A Converter" *IEEE Journal of Solid-State Circuits*, vol. SC-20, No. 6, Dec. 1985.

*Primary Examiner*—Brian K. Young
*Attorney, Agent, or Firm*—Richard A. Stoltz; James C. Kesterson; Richard L. Donaldson

[57] ABSTRACT

A digital to analog converter (10) and method is provided in which a plurality of digital to analog converter cells (16) generate an analog output signal based on a digital input signal, the cells being characterized by a switching threshold. An error signal circuit (22) generates a control voltage signal for controlling a first variable delay register (12). Signals latched by the first variable delay register (12) are characterized by rising and falling edges, and the first variable delay register (12) is controlled by the control voltage signal such that the rising and falling edges cross the switching threshold at substantially the same time.

21 Claims, 4 Drawing Sheets

METHOD AND APPARATUS FOR DIGITAL TO ANALOG CONVERSION WITH MINIMIZED DISTORTION

TECHNICAL FIELD OF THE INVENTION

This invention relates generally to electronic circuits, and more particularly to a method and apparatus for digital to analog conversion with minimized distortion.

BACKGROUND OF THE INVENTION

In digital to analog conversion ("DAC"), an analog output is generated by summing weighted currents corresponding to the various bits of a digital signal. A major cause of distortion in this analog output is the asymmetry, or skew, in the on and off switching times of these bit currents. For example, glitches may occur in the analog output when attempting to simultaneously turn some bit currents on and others off. The glitches result if all of these bit currents are momentarily on, causing larger than expected output current, or off, causing less than expected output current, before reaching their final states. For typical DAC architectures, the glitch distortion is worst at mid-scale, since this is where the largest opposing currents are being switched.

Asymmetry of bit current switching times also causes pulse width distortion. For example, a DAC input designed to produce a square wave output will actually cause an output with non-50% duty cycle. Although not as readily observable, the performance limitations of this distortion are of the same order of importance as the glitch distortion. The effects of both glitch and pulse width distortion increase as the conversion clock frequency increases, since the distorted time interval is constant, and this becomes a greater percentage of the clock period.

Both glitch and pulse width distortion can severely degrade DAC performance in certain applications. For example, in direct digital synthesis systems, digital to analog converters are used for sine wave reconstruction. In these systems, spectral purity of the output sine wave is often the most important consideration, and DAC performance is frequently the limiting factor. Both glitch and pulse width distortion produce harmonics of the intended sinewave. At low clock frequencies, where the distorted interval is a small percentage of the period, other effects will dominate, such as DC non-linearity. However, at high frequencies, skew distortion may become dominant, and is compounded for output frequencies greater than one-fourth of the conversion frequency, since the frequency of the aliased second harmonic can become very close to the output frequency and thus difficult if not impossible to filter out.

Existing techniques for minimizing these distortion effects present significant drawbacks. Such techniques include careful matching of critical path delays, switching threshold adjustments, or combinations of these approaches. Another technique is to use small off-chip capacitors on each of the three or four most significant bits. These techniques, however, are dependent upon process variations and changing operating conditions (such as power supply variations, voltage swings and temperature effects). With changing operating conditions, repeated adjustments are often required, and unpredictable performance results.

Therefore, a need has arisen for a method and apparatus for digital to analog conversion with minimized distortion that provides optimum performance over a wide range of process variations and operating conditions.

SUMMARY OF THE INVENTION

In accordance with the present invention, a method and apparatus for digital to analog conversion with minimized distortion is provided which substantially eliminates or reduces disadvantages and problems associated with prior art digital to analog conversion techniques.

In particular, a digital to analog converter and method of digital to analog conversion is provided in which a plurality of digital to analog converter cells generate an analog output signal based on a digital input signal, the cells being characterized by a switching threshold. A control voltage signal is generated by an error signal circuit and input to a first variable delay register. The first variable delay register latches the digital input signal, the latched digital input signal characterized by rising and falling edges. The first variable delay register is controlled by the control voltage signal such that rising and falling edges cross the switching threshold at substantially the same time.

In a particular embodiment, the error signal circuit includes a plurality of control digital to analog converter cells for generating an analog control signal based on a control digital signal, the control cells being characterized by a switching threshold. A differential amplifier generates the control voltage signal based on the difference between the analog control signal and a reference signal. A second variable delay register latches the control digital signal, and is characterized by rising and falling edges. The second variable delay register is controlled by the control voltage signal such that the rising and falling edges cross the switching threshold at substantially the same time.

Furthermore, a direct digital synthesis system is provided for generating sine waves The direct digital synthesis system includes a processor for determining the frequency of the sine wave to be generated, a conversion clock for generating a conversion frequency clock signal, and a sine wave look-up table memory coupled to the processor. The sine wave look-up table includes data for sine wave reconstruction which is output, under control of the processor, to a digital to analog converter as described An important technical advantage of the present invention is the fact that skew-induced distortion is minimized by insuring that rising and falling edges of signals input to converter cells cross the switching threshold at substantially the same time. Another important technical advantage of the present invention is the fact that sine waves with high spectral purity can be provided by a digital to analog converter and direct digital synthesis system according to the present invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1-7 of the drawings, like numerals being used for like and corresponding parts of the various drawings.

Figure 1:
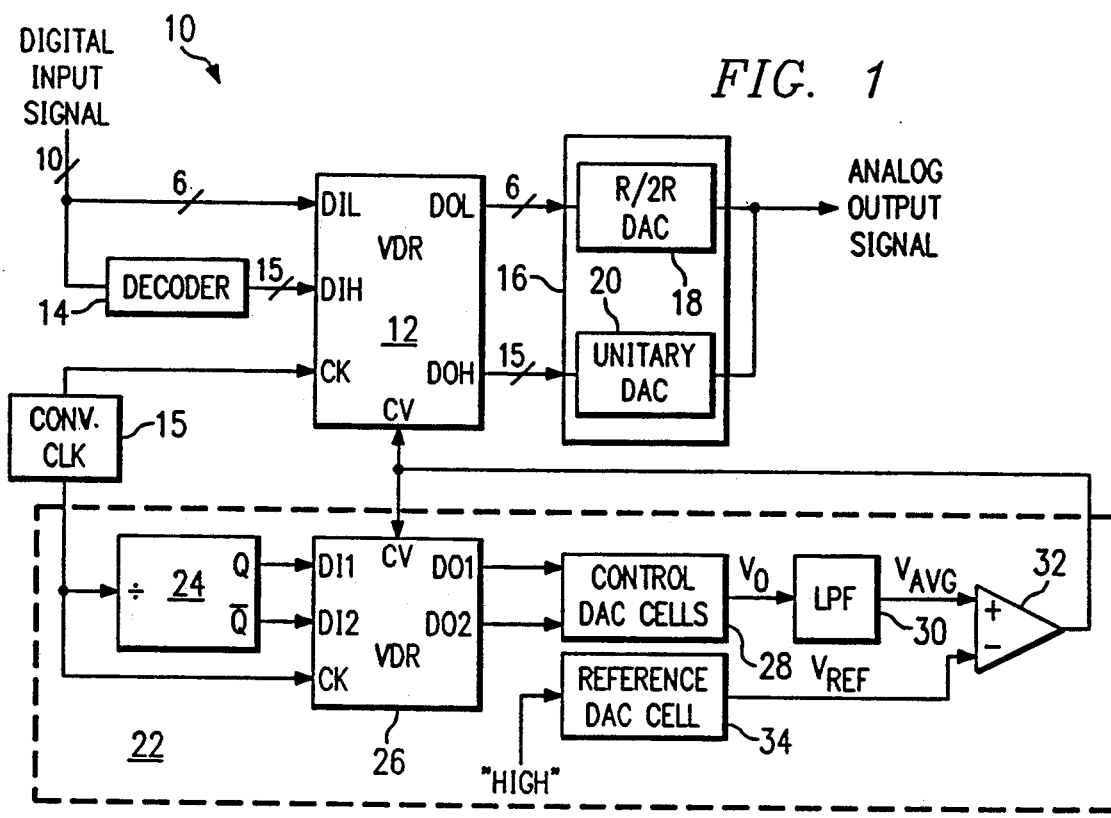
FIG. 1 illustrates a block diagram of one embodiment of a digital to analog converter with minimized distortion according to the teachings of the present invention.

FIG. 1 illustrates a block diagram of a particular embodiment of a digital to analog converter ("DAC") 10 with minimized distortion according to the present invention. A digital input signal is input to a variable delay register ("VDR") 12. For purposes of this discussion, a digital input signal of 10 binary bits will be described, it being understood that the present invention may be used with binary inputs having more or less bits. The six least significant bits are input directly into VDR 12. The four most significant bits are input to VDR 12 through a decoder 14. Decoder 14 converts the four most significant bits into 15 bits for greater resolution. It should be understood that decoder 14 is included for purposes of describing a particular embodiment, and that it could be omitted altogether, or other decoders, such as those outputting more or less bits, or those receiving more or less bits may be used without departing from the intended scope herein.

VDR 12 receives a conversion clock signal from a conversion clock 15. For this embodiment, the falling transition of the conversion clock signal causes the current state of the digital input signal to be transferred to the output of VDR 12 where it is held stable, regardless of changes at the input, until the next falling transition of the conversion clock signal The outputs of VDR 12 are coupled to digital to analog converter cells 16. DAC cells 16 switch current on or off when the rising or falling edges of outputs from VDR 12 cross a switching threshold. In a particular embodiment, DAC cells 16 include DAC cells 18 and DAC cells 20, with the six least significant bits from VDR 12 input to six bit R/2R DAC cells 18. The fifteen bit representation of the four most significant bits from VDR 12 is input to four-bit unitary DAC cells 20. The output of digital to analog converter cells 16 is the analog output signal.

A control voltage signal is also input to VDR 12. This control voltage signal is generated by an error signal circuit, indicated generally at 22, and is used to minimize skew-induced distortion. Error signal circuit 22 receives a clock input from the conversion clock 15. The clock input to error signal circuit 22 can be different from that generated by conversion clock 15 For example, the clock can be locally generated or externally supplied. The frequency is not critical but should be in the range of the highest anticipated conversion clock frequency. The clock is input to a divider 24, which in a particular embodiment is a divide by two clock. The output of divider 24 is a control digital signal input to VDR 26. The output from conversion clock 15 is also input directly to the clock input of VDR 26.

The output of VDR 26, a latched control digital signal, is input to control DAC cells 28. These control DAC cells 28 switch current on or off when the rising or falling edges of the outputs of VDR 26 cross a switching threshold. The output of control DAC cells 28 are input to a low-pass filter 30. The output of low pass filter 30 is input to differential amplifier 32. The other input of differential amplifier 32 is a reference signal received from reference DAC cell 34. Reference DAC cell is a digital to analog converter cell always maintained in a particular state. As shown in FIG. 1, a "high" signal is input to reference DAC cell 34. The output of differential amplifier 32 is an error signal fed back to both VDR 12 and VDR 26. This error signal is referred to as the control voltage signal VDR 12 and VDR 26 operate as data latches. In this particular embodiment, data on the input to these VDRs is transferred to the output on a falling transition of the conversion clock signal from conversion clock 15. Data on the outputs of VDR 12 and VDR 26 is held stable regardless of changing input signals, until the next active clock edge. The delay of either the rising or falling transitions on the output of these VDRs is controlled by the control voltage signal, which is an error signal proportional to the skew-induced distortion.

Figure 2:
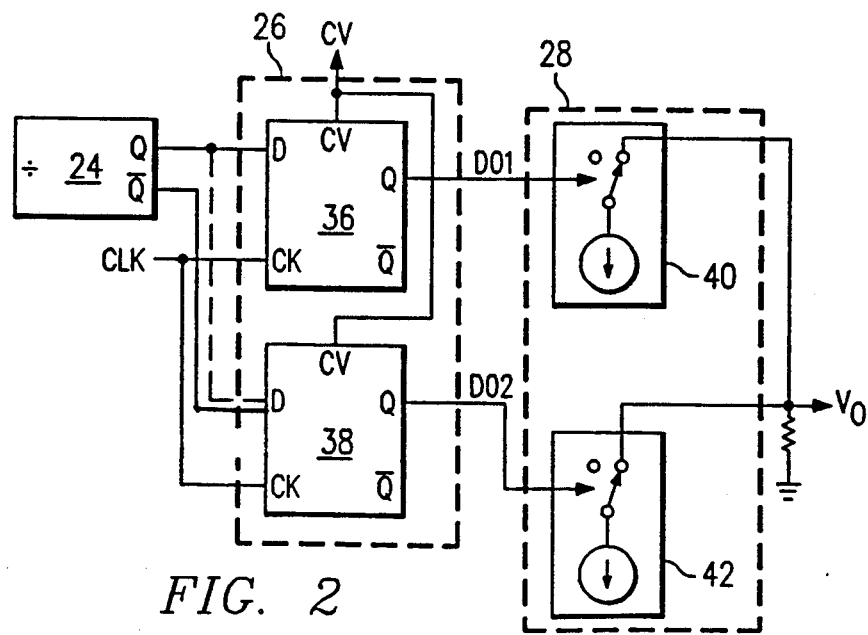
FIG. 2 illustrates a block diagram of one embodiment of control DAC cells and associated variable delay registers according to the teachings of the present invention.
Figure 3A:
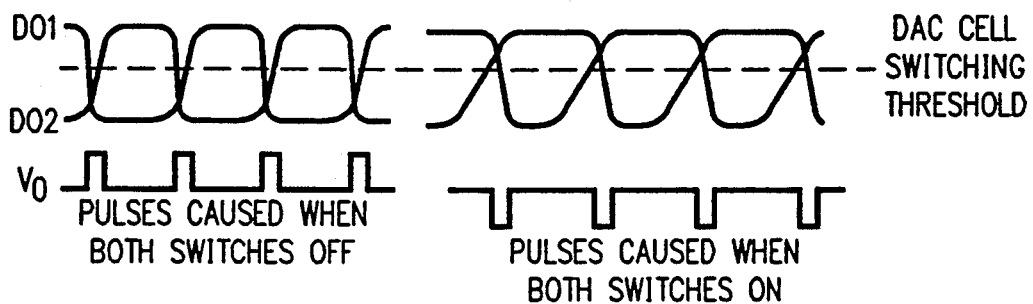
FIGS. 3a and 3b illustrate wave forms representing glitch distortion and ideal alignment.
Figure 3B:
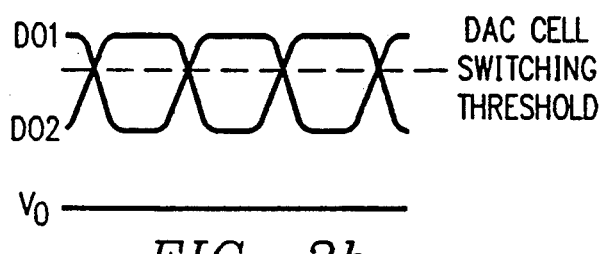

The operation of error signal circuit 22 is best understood by reference to FIGS. 2 and 3a-3b. As shown in FIG. 2, a particular embodiment of VDR 26 includes two latches, D flip-flops 36 and 38. Furthermore, control DAC cells 28 includes two equally weighted digital to analog converter cells 40 and 42. The input to cell 40 is taken from the Q output of flip-flop 36, and the control input to cell 42 is taken from the Q output of flip-flop 38. The outputs from DAC cells 40 and 42 are summed together to form an analog control signal, Vo.

The divider 24, which in a particular embodiment is a divide by two clock, generates the control digital signal. In the illustrated embodiment, the control digital signal is a complementary (out-of-phase) alternating 1/0 pattern at the Q and $\bar{Q}$ outputs of divider 24. This pattern is input to VDR 26. Thus, flip-flops 36 and 38 of VDR 26 each receive a 1/0 pattern, out of phase with respect to the other. It should be understood that the control digital signal could be generated in other ways without departing from the intended scope herein.

FIG. 3a illustrates the wave forms resulting from this pattern at the Q output of flip-flop 36 (D01), the Q output of flip-flop 38 (D02), and Vo. As can be seen, a train of pulses exists in the output signal Vo because of the skew associated with the D01 and D02 signals. As shown in FIG. 3a, the D01 signal drops below the DAC switching threshold before D02 rises above the DAC switching threshold. Likewise, D02 falls below the DAC switching threshold before D01 rises above the DAC switching threshold. It should be understood that the present invention includes the case where the rising transitions cross the threshold before the falling transitions, as also shown in FIG. 3a, wherein D01 and D02 rise above the switching threshold before the other falls below the threshold. Consequently, both DAC cells are off or on at times when only one should be off or on.

FIG. 3b illustrates the ideal case, in which the skews of D01 and D02 are such that the DAC switching threshold is crossed at the same time for both the rising and falling edges of the D01 and D02 signals. Because D01 and D02 are out of phase, Vo should equal the voltage output by either DAC cell 40 or 42 when on. As is shown by FIG. 3b, the rise and fall times do not have to be equal to have ideal alignment.

By filtering the Vo signal of FIG. 3a through low-pass filter 30, which may comprise a 20 picofarad capacitor, the pulses are averaged to generate an average voltage signal, $V_{AVG}$. This average voltage signal is input to differential amplifier 32 for a comparison with the output of reference DAC cell 34. Reference DAC cell 34 outputs a voltage signal, $V_{REF}$, equal to the voltage output by either of the control DAC cells 40 or 42 when on. Thus, any discrepancy between $V_{AVG}$ and $V_{REF}$ will be amplified and fed back to VDRs 12 and 26 as the control voltage signal.

The control voltage signal is used to alter the skew of the signals output by VDRs 12 and 26, so that the rising and falling edges of data at the output of these VDRs cross the switching threshold at substantially the same time. It should be understood that by stating crossing the switching threshold at substantially the same time, it is meant substantially the same time with respect to an active clock edge. During some transitions, there will only be rising or falling edges, corresponding to bits changing only in the same direction. In such cases, the present invention also operates such that the rising and falling edges all cross the switching threshold at substantially the same time.

It should be understood that the operation of error signal circuit 22 has been described in connection with a particular embodiment. Thus, VDR 26 has been described as including two D flip-flops, control DAC cells 28 has been discussed as including two DAC cells, and reference DAC cell 34 has been discussed in connection with a single cell. More or less flip-flops, or other latches, or more or less digital to analog converter cells could also be used without departing from the intended scope of the present invention. Furthermore, LPF 30 may follow differential amplifier 32 as opposed to preceding it as shown in FIG. 1.

It should be understood that the Q and $\overline{Q}$ outputs of one flip-flop, as opposed to the Q outputs of two flip-flops 36 and 38 shown in FIG. 2, could be used to provide the two out-of-phase D01 and D02 signals to control DAC cells 28. However, the use of two flip-flops, with one flip-flop dedicated to each control DAC cell is preferred in order to mirror more precisely the circuitry involved in the VDR 12 and DAC cells 16.

Figure 4:
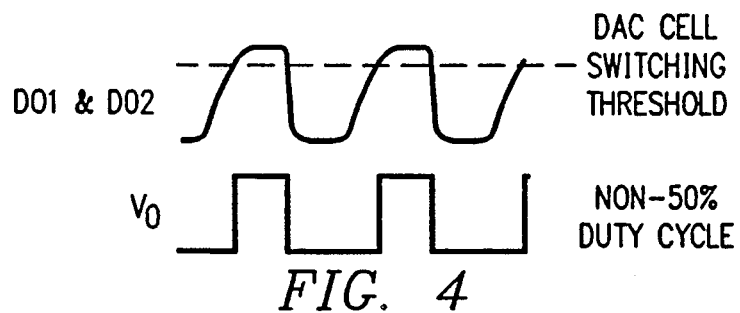
FIG. 4 illustrates wave forms representing pulse width distortion.

FIG. 2 also illustrates an embodiment, represented by the dashed line, where the same signal is input to both flip-flops 36 and 38 so that the inputs to control DAC cells 40 and 42 are in phase. This control technique makes use of the fact that skew-induced distortion leads to a non-50% duty cycle at the output of control DAC cells 28. This is illustrated in FIG. 4. As shown in FIG. 4, the Q outputs from flip-flops 36 and 38 of FIG. 2 are nearly equal. Because the time interval during which these outputs are above the threshold is different than that below the threshold, Vo will not be a 50% duty cycle square wave. Since the square wave is obtained by alternately switching the control DAC cells 28 off and on, the average value of the square wave should be identical to the output obtained from a single cell which is on all the time. This reference value is output by reference DAC cell 34. Since the output voltage from control DAC cells 28 is filtered through low-pass filter 30, any discrepancies between $V_{REF}$ and Vo will be amplified by differential amplifier 32 and fed back to VDR 12 and 26.

In either embodiment, since the VDR 26, the control DAC cells 28, and the reference DAC cell 34 are formed in the same integrated circuit as that of VDR 12 and DAC cells 16, the propagation delays and rise and fall times in the error signal circuit 22 will be nearly identical to those of the actual digital to analog converter circuit. Thus, the control signal generated by error signal circuit 22 will minimize distortion of the digital to analog circuit independent of process variations or of operational variations (such as power supply variations or temperature variations).

Figure 5A:
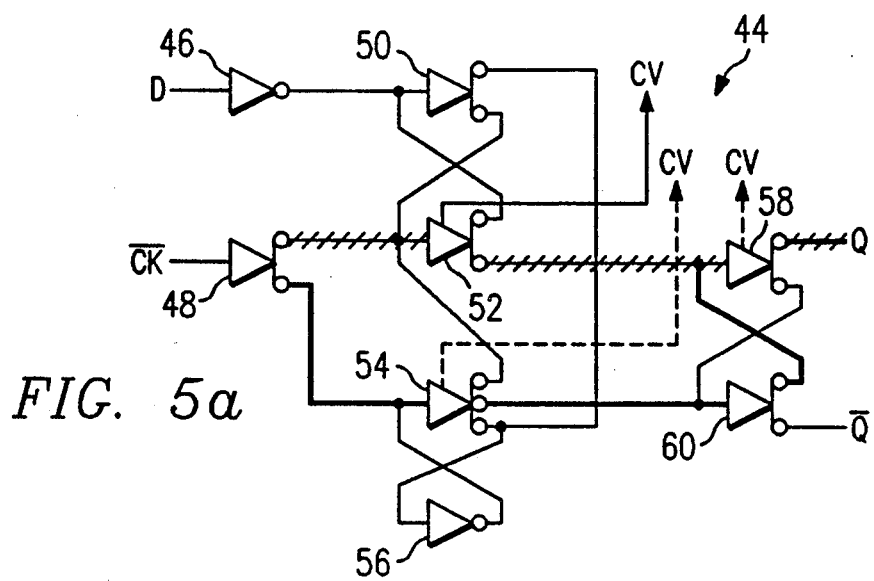
FIGS. 5a and 5b illustrate a particular embodiment of a latch of a variable delay register and details of HI$^2$L gates according to the teachings of the present invention.
Figure 5B:
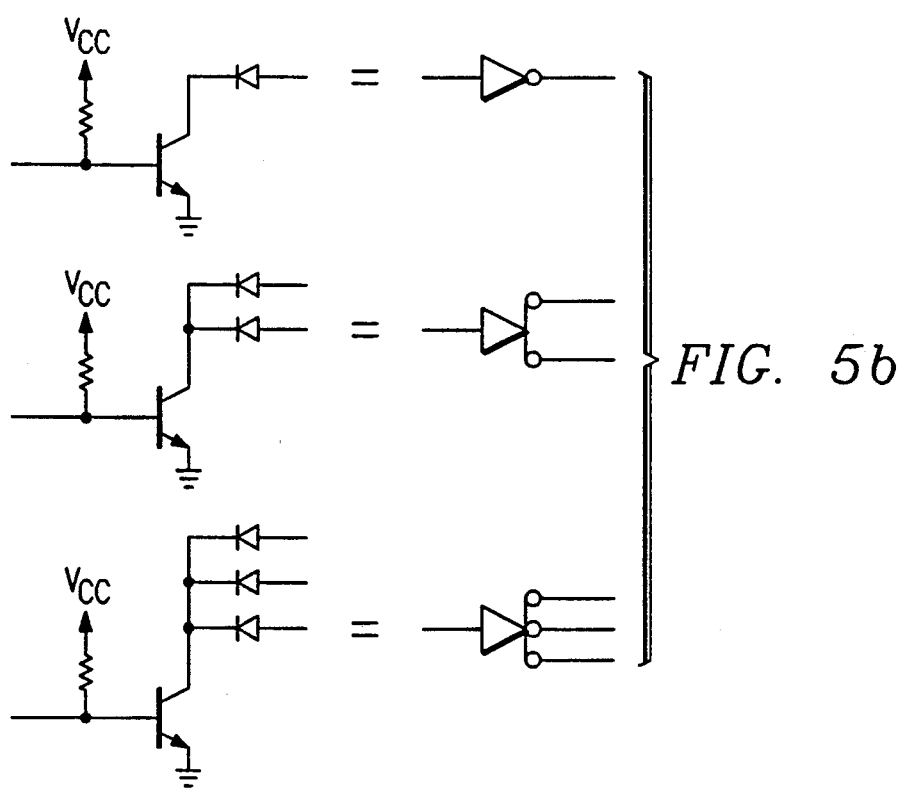

FIG. 5a illustrates a particular embodiment of one of the latches, which in this embodiment are D flip-flops, included within VDR 12 or VDR 26. The latch is referenced generally at 44. FIG. 5b shows circuits using gallium arsenide common emitter heterojunction integrated injection logic (HI$^2$L), which is particularly suited for the latches, corresponding to the gate symbols used in FIG. 5a. In the particular embodiment described in FIG. 1, VDR 12 would include 21 flip-flops, and VDR 26 would include two flip-flops (one for each DAC cell) such as that shown in FIG. 5a. The data is input to flip-flop 44 through an inverter 46. The clock signal is input to logic gate 48. The output of inverter 46 is input to the input of logic gate 50. One output of logic gate 48 is input to the input of logic gate 52. One output of logic gate 50 is also coupled to the input of logic gate 52, and one output of logic gate 52 is also coupled to the input of logic gate 50. A second output of logic gate 48 is also coupled to the input of logic gate 54. The output of logic gate 54 is coupled to the input of a logic gate 56. A second output of logic gate 50 is also coupled to the input of logic gate 56. The output of inverter 56 is also coupled to the input of logic gate 54. A second output of logic gate 52 is coupled to the input of logic gate 58. The output of logic gate 58 is the Q output of the D flip-flop 44. A second output of logic gate 54 is coupled to the input of a logic gate 60. The output of logic gate 60 is the $\overline{Q}$ output. A second output of logic gate 58 is also coupled to the input of logic gate 60, and a second output of logic gate 60 is also coupled to the input of logic gate 58. Finally, a second output of logic gate 50 is also coupled to the output of logic gate 54. The control voltage signal is input as the power supply to logic gate 52.

Flip-flop 44 operates to latch data to the output on active transitions of the clock input which for this embodiment is the falling edge. The path which determines the delay for a rising (0 to 1) transition of the Q output is indicated by the hashmarks, and the path for a falling (1 to 0) transition is indicated by the bold lines. The delay of these transitions can be independently controlled by varying the power supply levels of selected gates. For example, increasing the voltage input to logic gate 52 will decrease the delay of the rising transition of the Q output. Similarly, increasing the voltage supply to logic gates 54 or 58 (or both) will speed up the falling transition at the Q output. The power supply input to logic gate 52 is shown as the control voltage signal, CV. The power supply input to logic gates 54 and 58 are shown as dashed lines to CV, indicating the embodiment for speeding up the falling transition at the Q output.

Figure 6A:
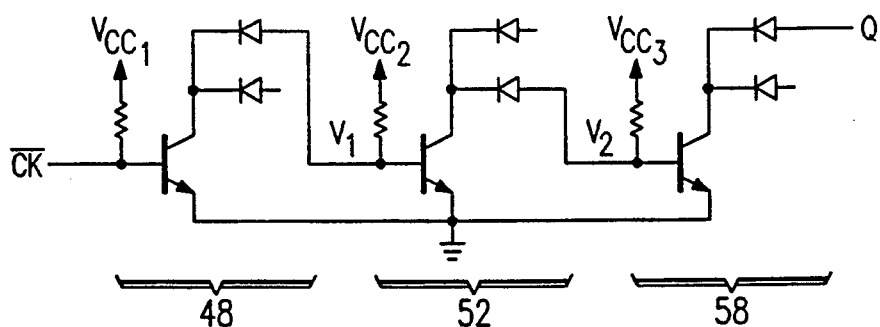
FIGS. 6a and 6b illustrate a particular embodiment and wave forms of inverters according to the teachings of the present invention.
Figure 6B:
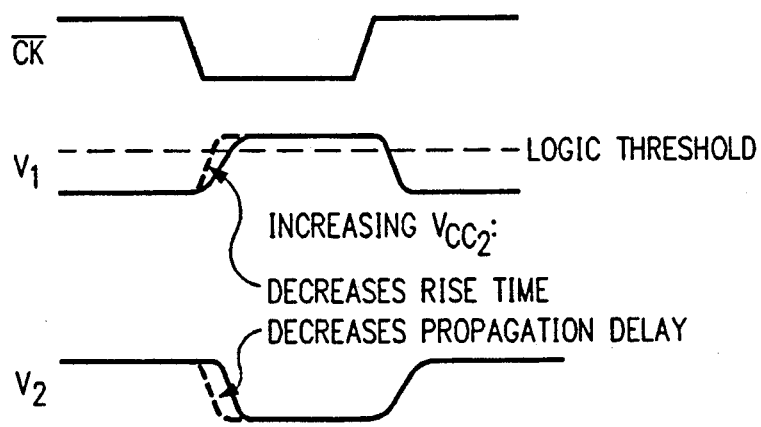

FIG. 6a and 6b illustrate a particular embodiment of representative circuitry, and associated waveforms, for the D flip-flop 44 shown in FIG. 5a. As shown in FIG. 6a, the string of logic gates 48, 52, and 58 are shown for clarity, it being understood that the circuitry used for each of these logic gates is used with the other logic gates shown in FIG. 5a as well. Gallium arsenide (GaAs) common emitter heterojunction integrated injection logic ("H1²L") is particularly suited for implementing the D flip-flops of VDRs 12 and 26.

FIGS. 5b, 6a and 6b illustrate implementations of the present invention with H1²L logic. As shown, each of the logic gates of D flip-flop 44 includes a transistor with its emitter coupled to ground (or common). The base of each transistor is coupled to a power supply through a resistor, and the input to each logic gate is through the base of the transistor. Furthermore, the outputs of each logic gate are through diodes coupled to the collector of the transistor. By changing the power supply voltages, $V_{CC1}$, $V_{CC2}$, and $V_{CC3}$ of each of the logic gates, the rise times and propagation delays through the flip-flop may be adjusted. For example, increasing $V_{CC2}$, the power supply to logic gate 52, results in decreasing the rise time at the output of logic gate 48, referred to as $V_1$, and decreasing the propagation delay through logic gate 52, as illustrated by the $V_1$ and $V_2$ wave forms shown in FIG. 6b. The effect is that the delay of the rising transition at the Q output will be decreased. Since a low impedance discharge path for capacitance associated with the input of logic gate 52 is provided when the transistor of logic gate 48 turns on, the $V_1$ fall time is virtually independent of $V_{CC2}$. Similarly, increasing the voltage supplies to logic gate 54 of FIG. 5a or logic gate 58 of FIGS. 5a and 6 (or both) will speed up the falling transition at the Q output. The rising edge of $V_2$ following the rising clock transition correctly illustrates the operation of inverters as connected in FIG. 6a. However, as connected within the flip-flop of FIG. 5a, along with the other circuitry of that flip-flop, $V_2$ can only change immediately following a falling clock transition. This is necessary as the function of the flip-flop is to latch and hold the data until the next falling clock transition.

As discussed, the voltage supplies to particular logic gates may be coupled to the control voltage signal output by amplifier 32 of FIG. 1. Thus, for example, with the control voltage signal as the voltage source to logic gate 52, if the delay of the rising edge is greater than the delay of the falling edge, as illustrated in the first set of waveforms of FIG. 3a, positive pulses will be generated and applied to the low-pass filter 30. A positive error voltage will result at the output of amplifier 32 resulting in the control voltage becoming more positive, causing less rising edge delay, narrower pulses, and less error voltage. The process continues until equilibrium is achieved, at which time the rising and falling delays should be nearly equal and DAC distortion should be minimum.

Figure 7:
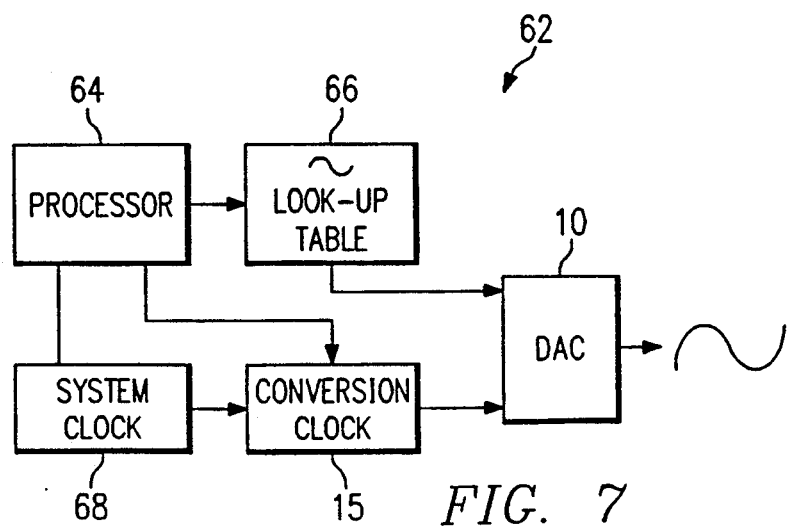
FIG. 7 illustrates a block diagram of a direct digital synthesis system according to the teachings of the present invention.

FIG. 7 illustrates a block diagram of a direct digital synthesis system 62 according to the teachings of the present invention. As shown in FIG. 7, a processor 64 is coupled to a sine wave look-up table memory 66, a system clock 68, and conversion clock 15. Conversion clock 15 and sine wave look-up table memory 66 are coupled to digital to analog converter 10. Digital to analog converter 10 operates as previously described in this disclosure. Processor 64 controls conversion clock 15 such that the clock signal generated by system clock 68 is divided to a chosen frequency. That chosen frequency, or conversion frequency, is output by conversion clock 15 to DAC 10. Processor 64 also accesses the sine wave look-up table memory 66.

Sine wave look-up table memory 66 contains information on sine wave forms for sine wave reconstruction. This information is in the form of sine wave datapoints, and is output, under the control of processor 64, to digital to analog converter 10. Digital to analog converter 10 then reconstructs and outputs an analog sine wave.

In summary, a method and apparatus for digital to analog conversion with minimum distortion is provided in which a control voltage signal is generated based upon the skew-induced distortion from a variable delay register. This control voltage signal is used to adjust rise or fall times and propagation delays within variable delay registers such that skew-induced distortion is minimized. A direct digital synthesis system is also disclosed which incorporates the DAC.

Although the present invention and its advantages has been described in detail, it should be understood that various changes, alterations or substitutions can be made without departing from the intended scope of the present invention as defined by the appended claims.

What is claimed is:

1. A digital to analog converter, comprising:
   a plurality of digital to analog converter cells operable to generate an analog output signal based on a digital input signal, said cells characterized by a switching threshold;
   an error signal circuit operable to generate a control voltage signal; and
   a first variable delay register operable to latch the digital input signal, the latched digital input signal characterized by rising and falling edges, said first variable delay register controlled by said control voltage signal such that said rising and falling edges cross said switching threshold at substantially the same time.

2. The converter of Claim 1, wherein said converter is fabricated using gallium-arsenide common emitter heterojunction integrated injection logic.

3. The converter of claim 1, wherein said error signal circuit includes:
   a plurality of control digital to analog converter cells operable to generate an analog control signal based on a control digital signal, said control cells characterized by said switching threshold;
   a reference signal;
   a differential amplifier operable to generate said control voltage signal based on the difference between said analog control signal and said reference signal; and
   a second variable delay register operable to latch the control digital signal, the latched control digital signal characterized by rising and falling edges, said second variable delay register controlled by said control voltage signal such that said rising and falling edges cross said switching threshold at substantially the same time.

4. The converter of claim 3, wherein:
   said plurality of control cells include two control cells of equal weight;
   said second variable delay register includes two latches for latching the control digital signal for said two control cells; and
   the control digital signal is an alternating pattern of logic highs and lows input to said latches in phase.

5. The converter of claim 3, wherein:

said plurality of control cells include two control cells of equal weight;

said second variable delay register includes two latches for latching the control digital signal for said two control cells; and the control digital signal is an alternating pattern of logic highs and lows input to said latches out of phase.

6. The converter of claim 3, wherein said error signal circuit further includes a reference digital to analog converter cell for generating said reference signal.

7. The converter of claim 3, wherein said error signal circuit further includes a low pass filter coupled between said control cells and said differential amplifier, said low pass filter operable to filter said analog control signal.

8. The converter of claim 3, wherein said converter is fabricated using gallium-arsenide common emitter heterojunction integrated injection logic.

9. The converter of claim 1, wherein said first variable delay register includes a plurality of latches, one each of said latches associated with one each of said digital to analog converter cells.

10. A direct digital synthesis system for generating sine waves, comprising:

a processor operable to determine the frequency of the sine wave to be generated;

a conversion clock coupled to said processor and operable to generate a conversion frequency clock signal;

a sine wave look up-table memory coupled to said processor, said sine wave look-up table memory including data for sine wave reconstruction; and a digital to analog converter coupled to said conversion clock and said sine wave look-up table memory, said converter operable to generate a sine wave of the determined frequency based on said conversion frequency clock signal and said data for sine wave reconstruction, said converter including:

a plurality of digital to analog converter cells operable to generate an analog output signal based on a digital input signal, said cells characterized by a switching threshold;

an error signal circuit operable to generate a control voltage signal; and a first variable delay register operable to latch the digital input signal, the latched digital input signal characterized by rising and falling edges, said first variable delay register controlled by said control voltage signal such that said rising and falling edges cross said switching threshold at substantially the same time.

11. The system of claim 10, wherein said converter is fabricated using gallium-arsenide common emitter heterojunction integrated injection logic.

12. The system of claim 10, wherein said error signal circuit includes:

a plurality of control digital to analog converter cells operable to generate an analog control signal based on a control digital signal, said control cells characterized by said switching threshold;

a reference signal;

a differential amplifier operable to generate said control voltage signal based on the difference between said analog control signal and said reference signal; and a second variable delay register operable to latch the control digital signal, the latched control digital signal characterized by rising and falling edges, said second variable delay register controlled by said control voltage signal such that said rising and falling edges cross said switching threshold at substantially the same time.

13. The system of claim 12, wherein:

said plurality of control cells include two control cells of equal weight;

said second variable delay register includes two latches for latching the control digital signal for said two control cells; and the control digital signal is an alternating pattern of logic highs and lows input to said latches in phase.

14. The system of claim 12, wherein:

said plurality of control cells include two control cells of equal weight;

said second variable delay register includes two latches for latching the control digital signal for said two control cells; and the control digital signal is an alternating pattern of logic highs and lows input to said latches out of phase.

15. The system of claim 12, wherein said error signal circuit further includes a reference digital to analog converter cell for generating said reference signal.

16. The system of claim 12, wherein said error signal circuit further includes a low pass filter coupled between said control cells and said differential amplifier, said low pass filter operable to filter said analog control signal.

17. The system of claim 12, wherein said error signal circuit further includes a low pass filter coupled to said differential amplifier such that said control voltage signal is generated after filtering by said low pass filter.

18. A method of converting digital signals to analog signals, comprising the steps of:

latching a digital input signal in a first variable delay register, the latched digital input signal characterized by rising and falling edges;

generating an analog output signal based on the digital input signal in a plurality of digital to analog converter cells, the cells characterized by a switching threshold;

generating a control voltage signal in an error signal circuit; and controlling the first variable delay register with the control voltage signal such that the rising and falling edges cross the switching threshold at substantially the same time.

19. The method of claim 18, wherein said step of generating a control voltage signal comprises:

latching a control digital signal in a second variable delay register, the latched control digital signal characterized by rising and falling edges;

generating an analog control signal based on the control digital signal in a plurality of control digital to analog converter cells, the control cells characterized by the switching threshold;

generating a reference signal;

generating the control voltage signal based on the difference between the analog control signal and the reference signal; and controlling the second variable delay register with the control voltage signal such that the rising and falling edges cross the switching threshold at substantially the same time.

20. The method of claim 19, wherein said step of latching comprises latching in phase an alternating pattern of logic highs and lows in two latches.

21. The method of claim 19, wherein said step of latching comprises latching out of phase an alternating pattern of logic highs and lows in two latches.

* * * * *